US006946724B2

United States Patent
Igarashi et al.

(10) Patent No.: US 6,946,724 B2
(45) Date of Patent: Sep. 20, 2005

(54) CIRCUIT DEVICE AND METHOD OF MANUFACTURE THEREOF

(75) Inventors: Yusuke Igarashi, Gunma (JP); Nobuhisa Takakusaki, Gunma (JP); Jun Sakano, Gunma (JP); Noriaki Sakamoto, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 0 days.

(21) Appl. No.: 10/733,726

(22) Filed: Dec. 11, 2003

(65) Prior Publication Data

US 2004/0169271 A1 Sep. 2, 2004

(30) Foreign Application Priority Data

Dec. 20, 2002 (JP) .................................... P. 2002-371027

(51) Int. Cl.⁷ ...................... H01L 23/495; H01L 23/28; H01L 23/48; H01L 23/52
(52) U.S. Cl. ..................... 257/669; 257/676; 257/666; 257/784; 257/787
(58) Field of Search ................................ 257/787, 784, 257/666, 669, 676

(56) References Cited

U.S. PATENT DOCUMENTS

| 4,942,452 A | * | 7/1990 | Kitano et al. | 257/666 |
| 5,157,475 A | * | 10/1992 | Yamaguchi | 257/784 |
| 6,143,981 A | * | 11/2000 | Glenn | 174/52.4 |
| 2003/0178707 A1 | * | 9/2003 | Abbott | 257/666 |

\* cited by examiner

*Primary Examiner*—Nitin Parekh
(74) *Attorney, Agent, or Firm*—Fish & Richardson P.C.

(57) ABSTRACT

A circuit device 10 comprises conductive patterns 11, separated by separation grooves 41, circuit elements 12, affixed onto conductive patterns 11, and an insulating resin 13, covering circuit elements 12 and conductive patterns 11 and filling separation grooves 41 while exposing the rear surfaces of conductive patterns 11. Constricted parts 19 are formed at side surfaces of separation grooves 41. At constricted parts 19, the width of separation grooves 41 is made narrower than at other locations. Thus by making insulating resin 13 adhere closely to constricted parts 19, the adhesion of insulating resin 13 with conductive patterns 11 is improved.

12 Claims, 12 Drawing Sheets

CIRCUIT DEVICE AND METHOD OF MANUFACTURE THEREOF

BACKGROUND OF THE INVENTION

1. Field of the Invention

The present invention relates to a circuit device and a method of manufacture thereof and particularly relate to a circuit device, with which separation grooves having constricted parts at side surfaces are formed by performing etching a plurality of times on a copper foil to form the separation grooves and the transient thermal resistance is restrained by forming conductive patterns thickly, and a method of manufacture of such a circuit device.

2. Description of the Related Art

Conventionally, due to being employed in portable telephones, portable computers, etc., circuit devices that are set in electronic equipment have been demanded to be compact, thin, and lightweight.

Recently, as general semiconductor devices called CSP's (chip size packages), wafer-scale CSP's of sizes equivalent to chips and CSP's of sizes slightly larger than chips have been developed.

FIG. 14 shows a CSP 66, which is slightly larger than a chip size and employs a glass epoxy substrate 5 as the supporting substrate. Here, a description shall be provided for the case where a transistor chip T is mounted onto glass epoxy substrate 65.

On the surface of this glass epoxy substrate 65, a first electrode 67, a second electrode 68, and a die pad 69 are formed. A first rear surface electrode 70 and a second rear surface electrode 71 are formed on the rear surface of this glass epoxy substrate 65. Via through holes TH, the above-mentioned first electrode 67 is electrically connected with first rear surface electrode 70 and second electrode 68 is electrically connected with second rear surface electrode 71. The above-mentioned transistor chip T is affixed in bare form onto die pad 69, the emitter electrode of the transistor is connected via a metal wire 72 to first electrode 67, and the base electrode of the transistor is connected via a metal wire 72 to second electrode 68. Furthermore, a resin layer 73 is provided on glass epoxy substrate 65 so as to cover transistor chip T.

Though employing a glass epoxy substrate 65, the above-mentioned CSP 66, unlike a wafer-scale CSP, has the merits of being simple in the extension structure from chip T to the rear surface electrodes 70 and 71 for external connection and being inexpensive to manufacture.

However, the above-described CSP 66 uses a glass substrate 65 as an interposer and this places on limit on making CSP 66 more compact and thinner. A circuit device 80, with which such a mounting substrate is made unnecessary as shown in FIG. 15, has thus been developed.

As shown in FIG. 15, circuit device 80 comprises conductive patterns 81, circuit elements 82 affixed onto conductive patterns 81, metal wires 84, electrically connecting circuit elements 82 and conductive patterns 81, and an insulating resin 83, covering circuit elements 82 and conductive patterns 81 while exposing the rear surfaces of conductive patterns 81. Circuit device 80 is thus arranged so that a mounting substrate is unnecessary and is formed more thinly and more compactly in comparison to CSP 66.

However, with the above-described circuit device 80, conductive patterns 81 are formed thinly and have a thickness of only approximately 40 $\mu$m, and since this causes increase of the transient thermal resistance, there was the problem that temperature rise of circuit device 80 occurs quickly due to heat generation by circuit elements 82. Also, if thick conductive patterns 81 are formed by forming separation grooves by a single time of etching, the separation grooves are formed to be wide in width, causing decrease of the effective area in which conductive patterns 81 are formed.

Furthermore, though side surfaces of conductive patterns 81 are formed to a curved form due to conductive patterns 81 being formed by etching, the adhesion with insulating resin 13 was not adequate and there was the problem that conductive patterns 81 peeled off from insulating resin 13.

This embodiments of present invention has been made in view of the above problems. One of objects of this embodiments of present invention is to provide a circuit device, having conductive patterns that are formed thickly in order to make the transient thermal resistance small, and a method of manufacturing such a circuit device. Another object of this invention is to provide a circuit device, with which the adhesion of an insulating resin with conductive patterns is improved by the provision of constricted parts at side surfaces of separation grooves that separate the conductive patterns.

SUMMARY OF THE INVENTION

The preferred embodiment of this invention firstly provides a circuit device comprising: conductive patterns separated by separation groove; circuit element, affixed onto the conductive pattern; and an insulating resin, covering the circuit elements and the conductive patterns and filling the separation grooves while exposing the rear surfaces of the conductive patterns; wherein constricted part is formed at side surface of the separation groove and the insulating resin is adhered to the constricted part. By forming constricted parts at the separation grooves, the adhesion of the conductive patterns with the insulating resin that fills the separation grooves can be improved.

The preferred embodiment of this invention secondly provides a circuit device comprising: conductive patterns separated by separation groove; circuit element, affixed onto the conductive pattern; and an insulating resin, covering the circuit element and the conductive patterns and filling the separation groove while exposing the rear surfaces of the conductive patterns; wherein the separation groove is formed of a plurality of grooves formed by etching a plurality of times. By thus forming separation grooves by a plurality of times of etching, the separation grooves can be formed deeply while being made as narrow in width as possible and the conductive patterns can be formed thickly.

The preferred embodiment of this invention thirdly provides a circuit device manufacturing method comprising: forming conductive patterns by forming separation grooves at locations of a conductive foil except locations that are to be the conductive patterns; positioning circuit element on the conductive pattern; and forming an insulating resin so as to cover the circuit element and fill the separation groove; wherein constricted part is formed on side surfaces of the separation grooves by a plurality of times of etching and the insulating resin is adhered to the constricted part.

The preferred embodiments of this invention provides the following effects.

Firstly, by forming separation grooves 41, which separate conductive patterns 11, by etching a plurality of times, constricted parts 19 can be formed in separation grooves 41. Thus by close adhesion of insulating resin 13, which seals the entirety, with constricted parts 19, the force of adhesion of conductive patterns 11 with insulating resin 13 can be improved.

Secondly, by forming separation grooves 41 by etching a plurality of times, separation grooves 41, with which the length in the depth direction is greater than that in the width direction, can be formed. Conductive patterns 11 can thus be formed thickly without spreading the width of separation grooves 41. The mounting density of the circuit device can thus be improved.

Thirdly, by forming conductive patterns 11 thickly, the transient thermal resistance can be made low and the heat radiation effect of the circuit device can be improved.

Fourthly, in the step of forming separation grooves 41, a common mask 30 can be used to perform exposure of first resist PR1 and second resist PR2. Separation grooves 41 having constricted parts 19 provided at the side surfaces can thus be formed without having to prepare masks separately.

DESCRIPTION OF THE PREFERRED EMBODIMENTS (First Embodiment for Describing a Configuration of a Circuit Device)

Figure 1A:
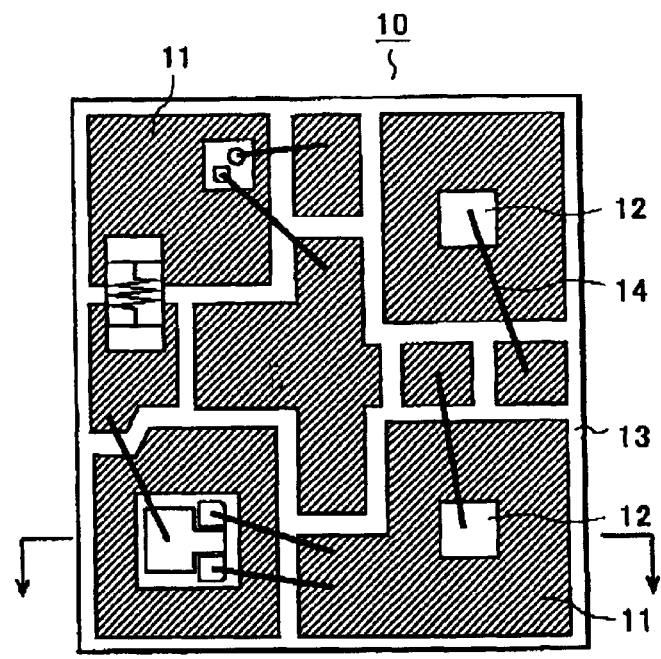
FIG. 1 is a plan view (A), a sectional view (B), and an enlarged sectional view (C) showing a circuit device of the preferred embodiment.

As shown in FIG. 1, a circuit device 10 comprises conductive patterns 11, separated by separation grooves 41, circuit elements 12, affixed onto conductive patterns 11, and an insulating resin 13, covering circuit elements 12 and conductive patterns 11 and filling separation grooves 41 while exposing the rear surfaces of conductive patterns 11; and is arranged with constricted parts 19 being formed at side surfaces of separation grooves 41 and insulating resin 13 being closely adhered to constricted parts 19. This configuration shall now be described in detail.

The material of conductive patterns 11 is selected in consideration of brazing material attachment property, bonding property, and plating property, and as this material, a conductive foil having Cu as the principal material, a conductive foil having Al as the principal material, or a conductive foil formed of an alloy, such as Fe—Ni, etc., is employed. Here, a configuration in which conductive patterns 11 are embedded in insulating resin 13 with their rear surfaces exposed and electrically separated by separation grooves 41 is realized. Also at the four corners of circuit device 10, land-form conductive patterns 11, onto which circuit elements 12 are mounted, are formed and conductive patterns 11, serving as bonding pads for metal wires 14, are formed in between. Also, at the rear surfaces of conductive patterns 11 that are exposed from insulating resin 13 are provided external electrodes 15 formed of soft solder or other brazing material. Conductive patterns 11 are formed by etching and the side surfaces thereof are formed to curved surfaces, each provided with a protrusion at an intermediate part. Locations of the rear surface of the device at which external electrodes 15 are not provided are covered by a resist 16. Here, conductive patterns 11 are formed to be 140 µm or more in thickness.

Semiconductor elements, such as transistors, diodes, IC chips, etc., and passive elements, such as chip capacitors, chip resistors, etc., may be cited as examples of circuit elements 12. Though the thickness will be greater, face-down semiconductor elements, such as CSP's, BGA's, etc., may also be mounted. Circuit elements 12 that are mounted here in face-up manner are electrically connected via metal wires 14 to other conductive patterns 11.

Insulating resin 13 covers circuit elements 12, metal wires 14, and conductive patterns 11 while exposing the rear surfaces of conductive patterns 11. As insulating resin 13, a thermosetting resin or a thermoplastic resin may be employed. Also, separation grooves 41, which separate the respective conductive patterns 11, are filled with insulating resin 13.

Furthermore, the circuit device 10 of the preferred embodiment is supported in its entirety by insulating resin 13.

Separation grooves 41 are formed between the respective conductive patterns by a plurality of times of etching and have constricted parts 19 formed at their intermediate parts. The width in the lateral direction of constricted parts 19 are formed narrower than the other locations of separation grooves 41. Thus by insulating resin 13 adhering closely to constricted parts 19, since the side surfaces of constricted parts 41 correspond to the side surfaces of conductive patterns 11, the strength of adhesion of conductive patterns 11 with insulating resin 13 can be improved. As mentioned above, separation grooves 41 are formed by etching the same locations of the conductive foil, which is the material of conductive patterns 11, a plurality of times. Separation grooves 41 are thus made greater in their depth than in their width. Also, constricted parts 19 are formed continuously across all side surfaces of separation grooves 11.

Figure 1B:
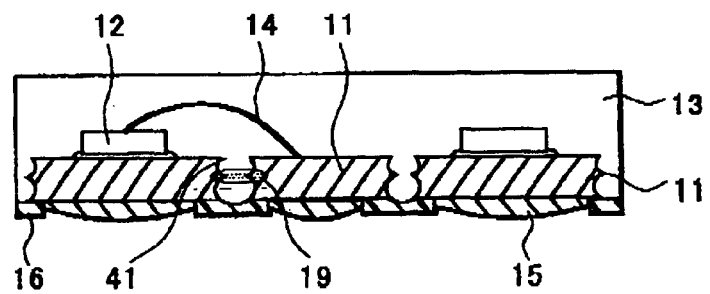

Now referring to FIG. 1(B), since separation grooves 41 are formed by etching twice, separation grooves 41 are formed so that their depth is approximately twice their width. In a case where separation grooves 41 are formed by etching an even greater number of times, their depth can be made even greater than their width. Also, since the thickness of conductive patterns 11 correspond to the depth of separation grooves 41, conductive patterns 11 that are formed to be thicker than the width of the separation grooves can be formed by the preferred embodiment.

Figure 1C:
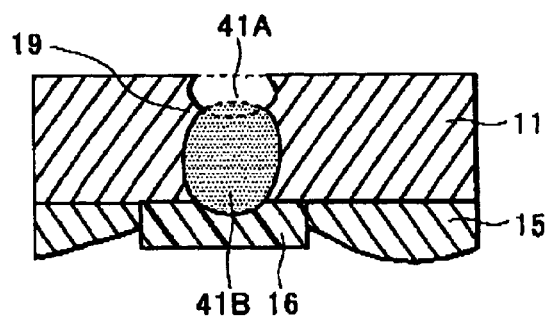

FIG. 1(C) is an enlarged sectional view of a location at which a separation groove 41 of FIG. 1(B) is formed. The details of separation groove 41 shall now be described with reference to FIG. 1(C). With the preferred embodiment, a separation groove 41 is formed by performing etching a plurality of times. A separation groove 41 is thus formed by two times or more of etching, and as the number of times etching increases, the number of constricted parts 19 formed at the side parts of separation groove 41 increases as well.

In the case where a separation groove 41 is formed by two times of etching, separation groove 41 is formed of a first separation groove 41A, formed by the first time of etching, and a second separation groove 41B, formed by the second time of etching. Here, second separation groove 41B is formed to be greater in cross-sectional area than first separation groove 41A. Thus by constricted part 19 being formed near the upper part of separation groove 41, the side surfaces of conductive patterns 11 that are formed of first separation groove 41A protrude into separation groove 41 in an eaves-like form into separation groove 41. The adhesion of conductive patterns 11 and insulating resin 13, filled in separation groove 41, is thus improved by the anchor effect between these components.

Figure 2A:
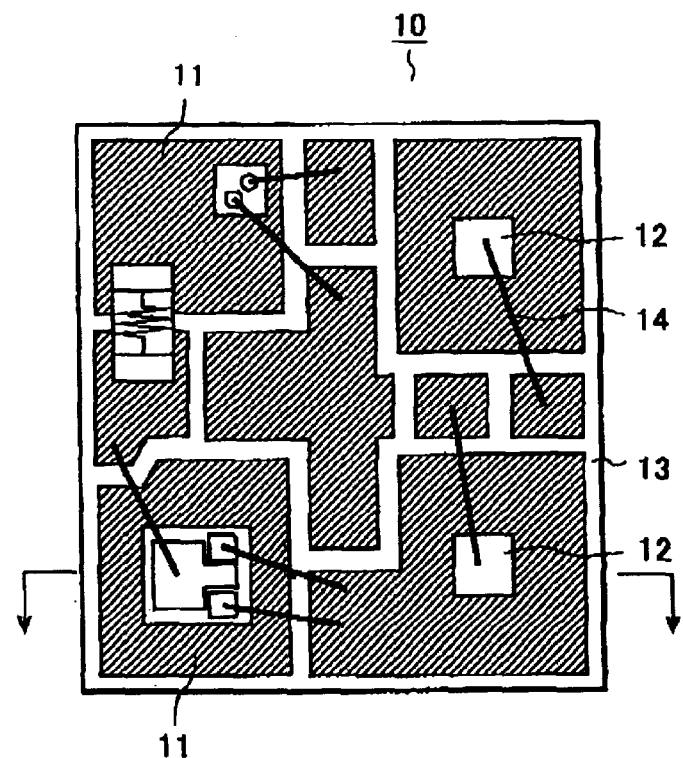
FIG. 2 is a plan view (A) and a sectional view (B) showing a circuit device of the preferred embodiment.
Figure 2B:
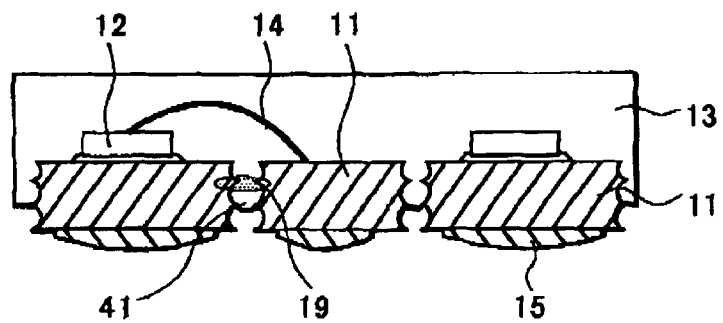

Referring now to FIG. 2, the configuration of circuit device 10 of another form shall be described. The basic arrangement of circuit device 10 described here is the same as that shown in FIG. 1, the difference being that conductive patterns 11 are exposed in a protruding manner from the rear surface of the insulating resin. Here, the rear surfaces and parts of the side surfaces of conductive patterns 11 are exposed from insulating resin 13. Conductive patterns 11 can thus be formed even more thickly than the circuit device shown in FIG. 1. Specifically, conductive patterns 11 can be formed to be 250 μm to 300 μm in thickness. The thermal radiation effect of conductive patterns 11 can thus be improved.

Figure 3:
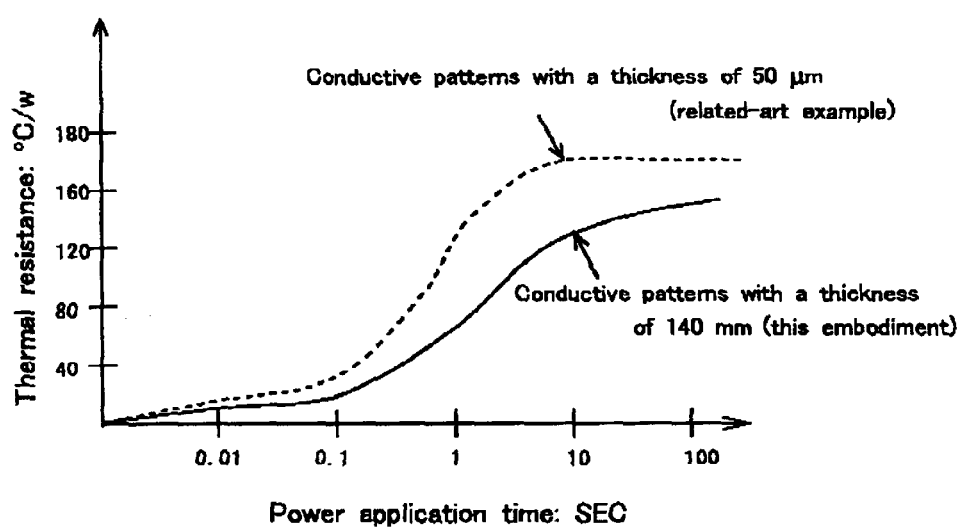
FIG. 3 is a characteristics diagram showing the thermal resistance values of a circuit device of the preferred embodiment.

Referring now to FIG. 3, the results of conducting an experiment comparing the transient thermal resistance using a related-art circuit device 80 and this circuit device 10 of this embodiment shall now be described. The abscissa axis of this graph indicates the power application time in logarithmic scale and the ordinate axis indicates the measured thermal resistance. The power application time indicated by the abscissa axis indicates the duration during which power is supplied to a circuit device, and the thermal resistance indicated by the ordinate axis indicates the degree of temperature rise when power is supplied. That the thermal resistance is low thus indicates that the heat radiating property of the circuit device is excellent.

Figure 15:
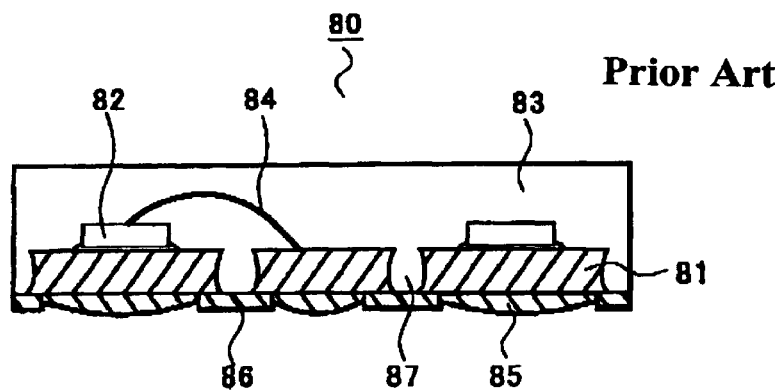
FIG. 15 is a sectional view showing a related-art circuit device.

The dotted line indicates the experimental results for the related-art type circuit device 80, which is shown in FIG. 15 and has conductive patterns 81 formed to a thickness of approximately 50 μm. The solid line indicates the experimental results for the circuit device 10 of preferred embodiment, having conductive patterns 11 formed to a thickness of approximately 140 μm.

The experimental results for the related-art circuit device indicate that the thermal resistance rises rapidly at a power application time of approximately 1 second and levels off at 180° C./W at 10 seconds and onwards. The experimental results for circuit device 10 of preferred embodiment, having thickly formed conductive patterns 11, indicate that the thermal resistance remain at values lower than those of the related art. In particular, the thermal resistance value for the preferred embodiment is approximately 30% lower than that of the related art at a power application time of approximately 10 seconds. The above shows that the circuit device 10 of preferred embodiment, having thickly formed conductive patterns 11, provides the merit of being lower in transient thermal resistance in comparison to the related art.

(Second Embodiment for Describing a Circuit Device Manufacturing Method)

A method of manufacturing circuit device 10 shall now be described with reference to FIG. 4 to FIG. 13. A circuit device manufacturing method of this embodiment comprises the steps of forming conductive patterns 11 by forming separation grooves 41 at locations of a conductive foil besides locations that are to be conductive patterns 11, positioning circuit elements 12 on conductive patterns 11, and forming insulating resin 13 so as to cover circuit elements 12 and fill separation grooves 13, and forming constricted parts 19 on side surfaces of separation grooves 41 by forming separation grooves 41 by a plurality of times of etching and closely adhering insulating resin 13 to constricted parts 19. The following shall describe the above-described respective steps in detail.

As shown in FIG. 4 to FIG. 8, in the first step of this embodiment, a conductive foil 40 is prepared, and by performing etching a plurality of times, separation grooves 41 provided with constricted parts 19 are formed.

Figure 4A:
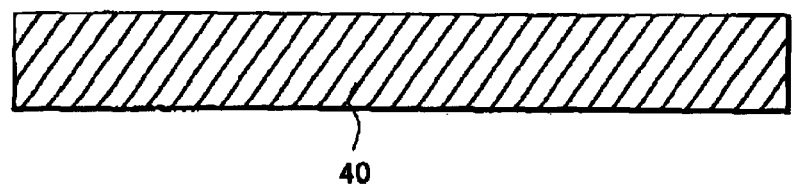
FIG. 4 is a sectional view (A) and a plan view (B) showing a circuit device manufacturing method of the preferred embodiment.

In this step, first, a sheet-form conductive foil 40 is prepared as shown in FIG. 4(A). The material of this conductive foil 40 is selected in consideration of brazing material attachment property, bonding property, and plating property, and as this material, a conductive foil having Cu as the principal material, a conductive foil having Al as the principal material, or a conductive foil formed of an alloy, such as Fe—Ni, etc., is employed.

Figure 4B:
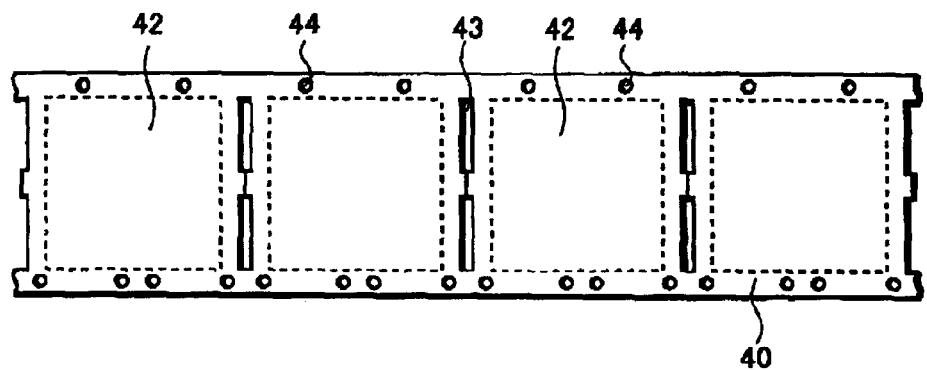

The thickness of the conductive foil is preferably approximately 10 μm to 300 μm in consideration of subsequent etching. Specifically, as shown in FIG. 4(B), four to five blocks 42, on which a plurality of mounting parts will be formed, are aligned in a spaced manner along conductive foil 40 of strip-like form. Between each block are provided slits 43 for absorbing the stress that arises in conductive foil 40 in a heating process in the molding step, etc. Also, index holes 44 are provided at fixed intervals at the upper and lower peripheral edges of conductive foil 40 and these are used for positioning in the respective steps.

Next, conductive patterns 11 are formed in each block. First as shown in FIG. 5, a first resist PR1, which is an etch-resistant mask, is formed and photoresist PR1 is patterned so that conductive foil 40 is exposed at regions except the regions that are to become conductive patterns 11.

Figure 5A:
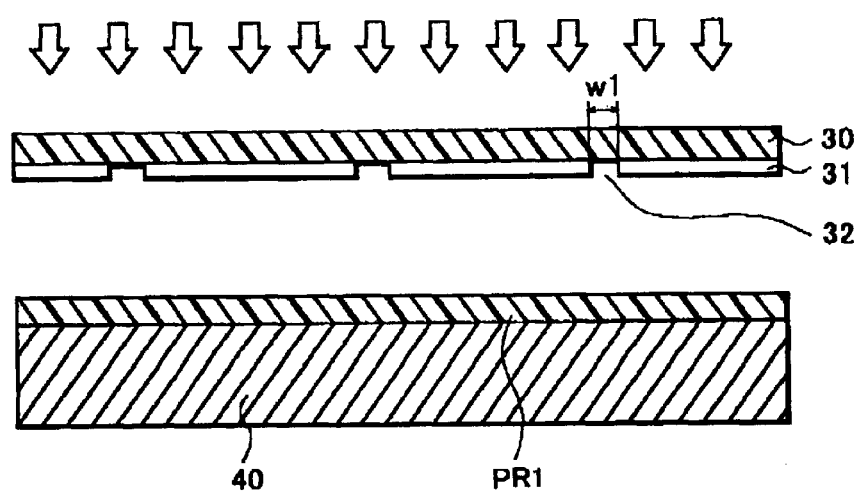
FIG. 5 is a sectional view (A) and a sectional view (B) showing a circuit device manufacturing method of the preferred embodiment.

Specifically, as shown in FIG. 5(A), first resist PR1 is formed over the entire top surface of conductive foil 40 in which conductive patterns 11 are to be formed. Then using a mask 30, exposure of the first resist is performed at locations at which separation grooves 41 are to be formed. Specifically, a light blocking material 31 is formed at locations of mask 30 that correspond to locations that are to become conductive patterns 11 and openings 32, at which light blocking material 31 is not provided, are formed at locations at which separation grooves 41 are to be formed. Thus by illuminating light that progresses parallel to conductive foil 40 from above mask 30, first resist PR1 is exposed just at the locations at which separation grooves 41 are to be formed. Here, if the width of an opening formed at the mask is W1, the opening provided in resist PR1 will also be formed to have the width W1.

Figure 5B:
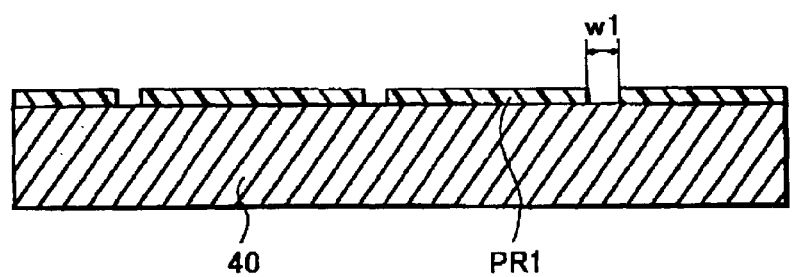

Referring now to FIG. 5(B), by performing a development process, first resist PR1 is removed just at the exposed locations and the top surface of conductive foil 40 becomes exposed at locations at which separation grooves 41 are to be formed. Separation grooves 41 are then formed by etching. The separation grooves 41 that are formed by etching have a depth, for example, of 50 μm and the side surfaces thereof are rough surfaces and are thus improved in adhesion to insulating resin 13.

As the etchant used here, ferric chloride or cupric chloride is mainly employed, and the abovementioned conductive foil is dipped in this etchant or is showered with this etchant. Since generally with wet etching, etching is performed in a non-anisotropic manner, the side surfaces become curved structures.

Figure 6A:
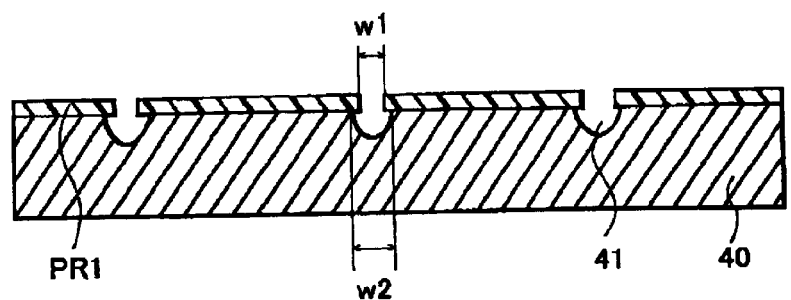
FIG. 6 is a sectional view (A) and a plan view (B) showing a circuit device manufacturing method of the preferred embodiment.

Referring now to FIG. 6(A), the section on which etching has been performed shall be described. Since the etching removes conductive foil 40 in an isotropic manner, the width W2 of separation groove formed by etching is made greater than the width W1 of the openings of first resist PR1. Also, the width W1 of the openings of first resist PR1 is the same as the width W1 of the mask for performing exposure. It can thus be understood that the width W2 of the openings of separation grooves 41 is made greater than the width W1 of the mask for performing exposure.

Figure 6B:
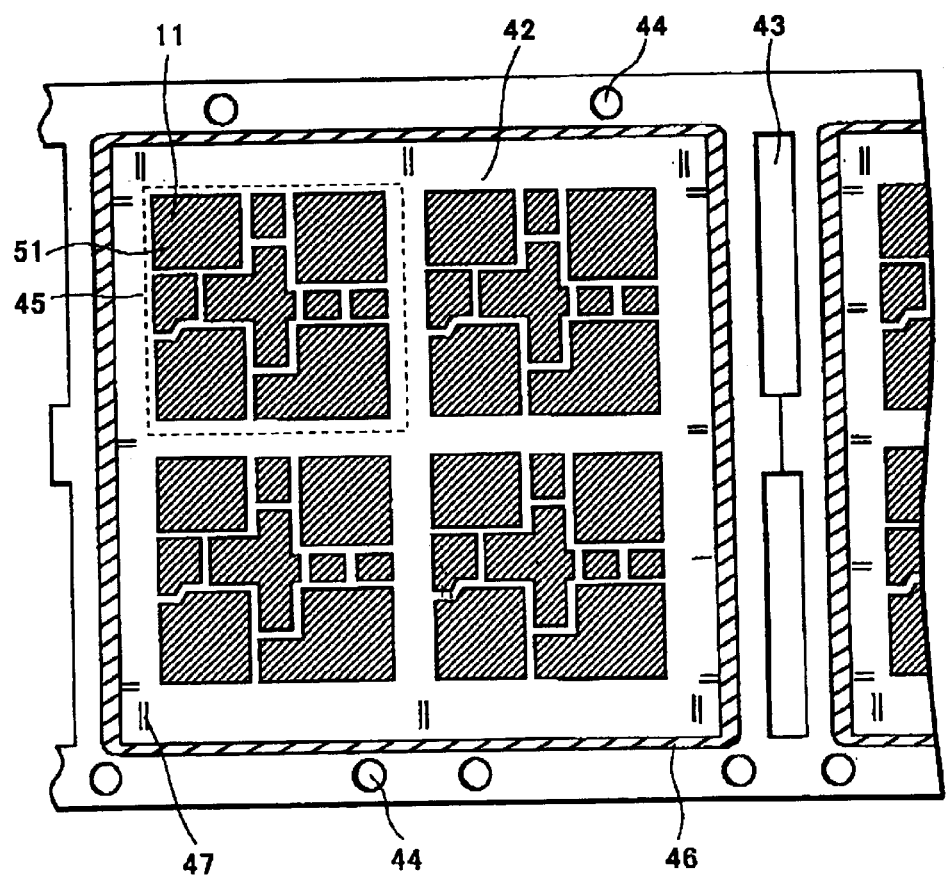

Specific conductive patterns 11 are shown in FIG. 6(B). In this figure, conductive patterns corresponding to one of blocks 42 shown in FIG. 4(B) are shown in an enlarged manner. A region surrounded by dotted lines is one mounting part 45 in which conductive patterns 11 are arranged, and on one block 42, a plurality of mounting parts 45 are aligned in the form of a matrix, and the same conductive patterns 11 are formed at each mounting part 45.

Figure 7A:
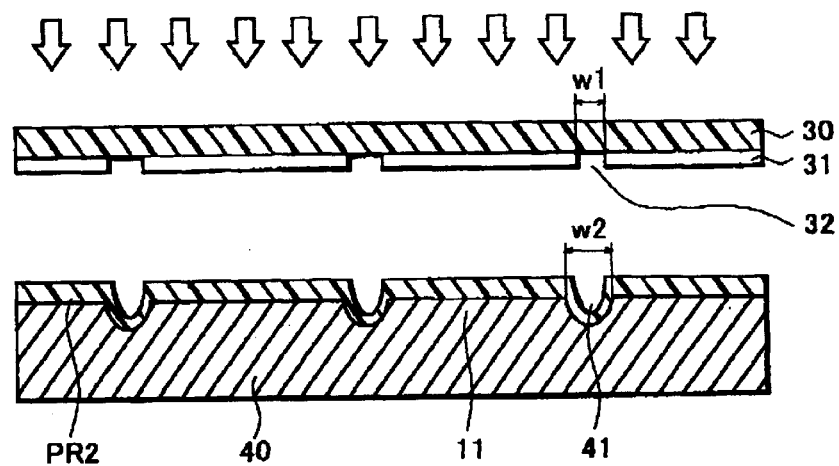
FIG. 7 is a sectional view (A), a sectional view (B), and a sectional view (C) showing a circuit device manufacturing method of the preferred embodiment.
Figure 7B:
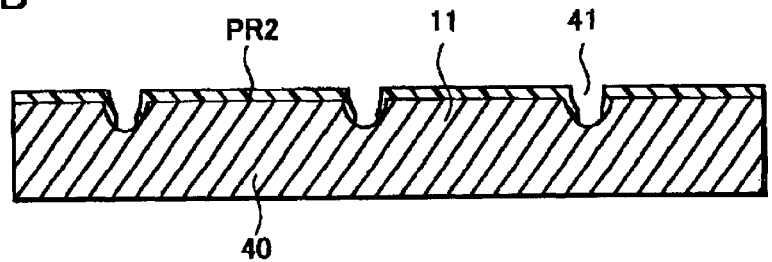
Figure 7C:
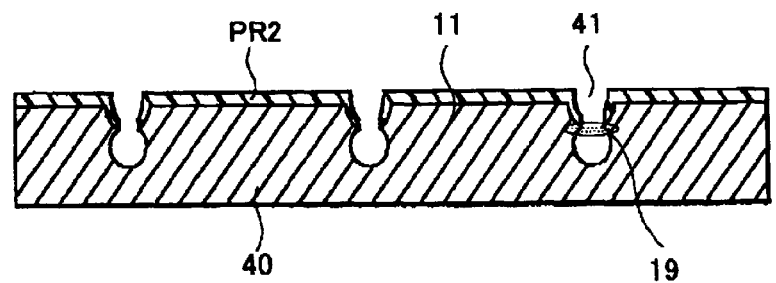

Referring now to FIG. 7, a method by which constricted parts 19 are formed by etching separation grooves 41 further shall be described.

As shown in FIG. 7(A), after peeling and removing first resist PR1, a second resist PR2 is formed on the top surface of conductive foil 40, including the top surfaces of separation grooves 41. Then using the same mask 30 as the mask used on first resist PR1, exposure of second resist PR2 is carried out. As mentioned above, the width W2 of the openings of separation grooves 41 is made wider than the opening width W1 of openings 32 provided in mask 30. Thus when second resist PR2 is exposed using mask 30, though the second resist PR2 near the bottom parts of separation grooves 41 will be exposed, the second resist PR2 at side surfaces of separation grooves 11 will not be exposed.

Second resist PR2, which has been exposed as described above, is then subject to a development process as shown in FIG. 7(B). The second resist PR2 that is formed at the side surfaces of separation grooves 11, which are not exposed, thus remains. Second resist PR2 thus covers the top surface of conductive foil 40 while leaving just the vicinities of the bottom parts of separation grooves 41 exposed.

Etching is then performed to form constricted parts 19 as shown in FIG. 17. By the etching progressing in an isotropic manner from the exposed bottom surfaces of separation grooves 41, separation grooves 41 are formed deeply and constricted parts 19 are formed near the intermediate parts in the depth direction of the separation grooves. By thus forming the separation grooves by a plurality of times of etching, constricted parts 19 of narrowly formed width can be formed. Furthermore, deep separation grooves of a width equivalent to separation grooves formed by one time of etching can be formed. Conductive patterns 11 can thus be formed thickly without widening the width of separation grooves 41. Second resist PR2 is removed after separation grooves 41 have been formed.

Furthermore, though in the above description, the exposure of first resist PR1 and the exposure of second resist PR2 were performed using the same mask, second resist PR2 may instead be exposed using a mask 30 with narrowly formed openings 32.

Referring now to FIG. 8, a method of performing etching again using just first resist PR1 shall be described. Whereas in the above description, second resist PR2 is formed after removing first resist PR1 to form constricted parts 19, here, etching is performed again using first resist PR1 to form constricted parts 19.

Figure 8A:
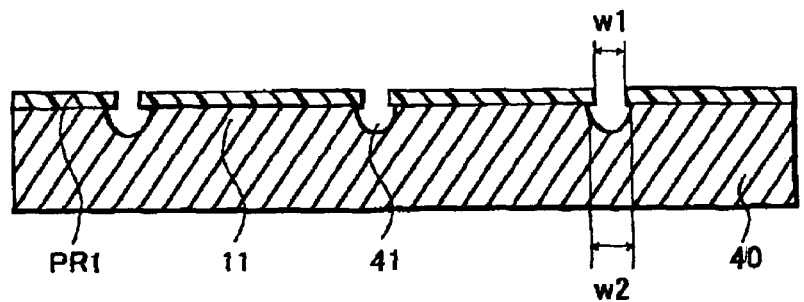
FIG. 8 is a sectional view (A), a sectional view (B), and a sectional view (C) showing a circuit device manufacturing method of the preferred embodiment.

By performing etching using first resist PR1, separation grooves 41 are formed as shown in FIG. 8(A). By the etching progressing in an isotropic manner, the opening width W2 of the separation grooves is formed more wider than the opening width W1 of first resist PR1. Thus at the openings of separation grooves 41, the first resist protrudes in an eaves-like manner.

Figure 8B:
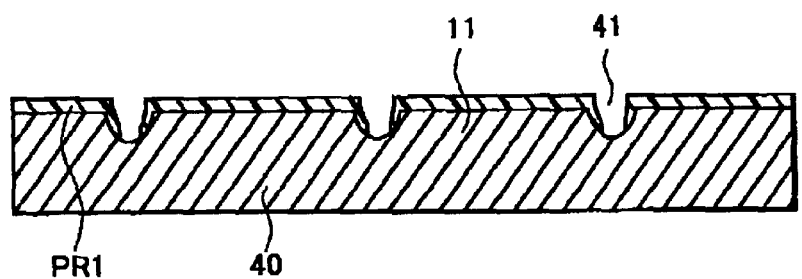

Referring now to FIG. 8(B), first resist PR1 is then heated to soften first resist PR1. First resist PR1, which protrudes in an eaves-like manner at the openings of separation grooves 41, is thereby made to cover the side surfaces of separation grooves 41. A structure in which just the vicinities of the bottom parts of separation grooves 41 are exposed from first resist PR1 is thereby realized.

Figure 8C:
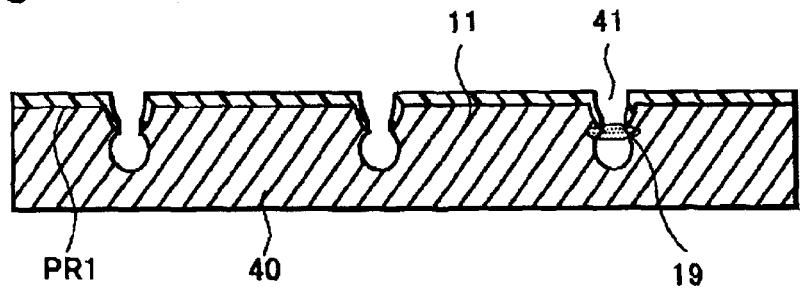

By then performing etching again using first resist PR1 as shown in FIG. 8(C), constricted parts 19 are formed and separation grooves 41 are formed more deeply. After completion of etching, first resist PR1 is removed.

Figure 9A:
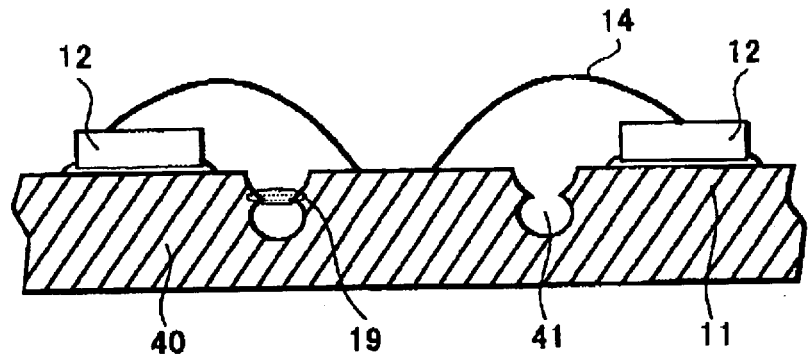
FIG. 9 is a sectional view (A) and a plan view (B) showing a circuit device manufacturing method of the preferred embodiment.
Figure 9B:
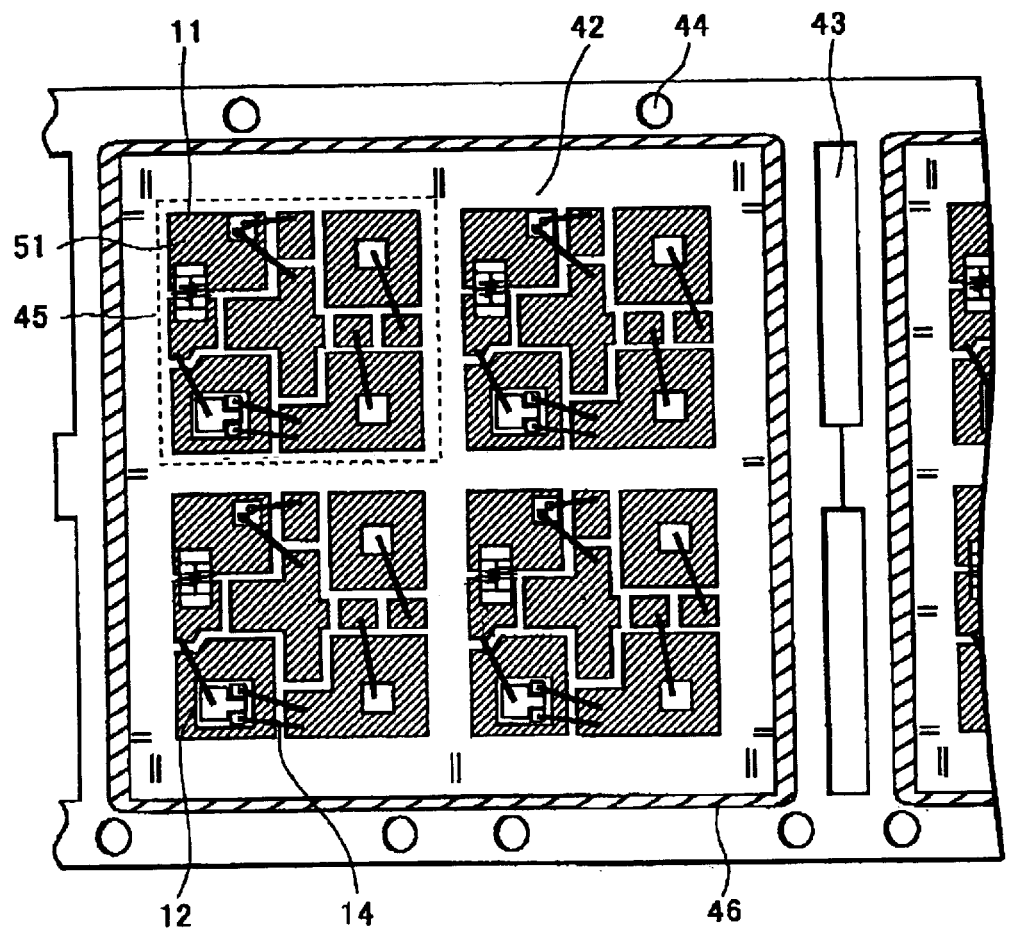

In the second step of this embodiment, circuit elements 12 are affixed onto the respective mounting parts 45 of the desired conductive patterns 11 and connection means, electrically connecting the electrodes of circuit elements 12 at the respective mounting parts 45 with the desired conductive patterns 11, are formed as shown in FIG. 9.

Circuit elements 12 may be semiconductor elements, such as transistors, diodes, IC chips, etc., or passive elements, such as chip capacitors, chip resistors, etc. Though the thickness will be greater, face-down semiconductor elements, such as CSP's, BGA's, etc., may also be mounted.

Figure 10:
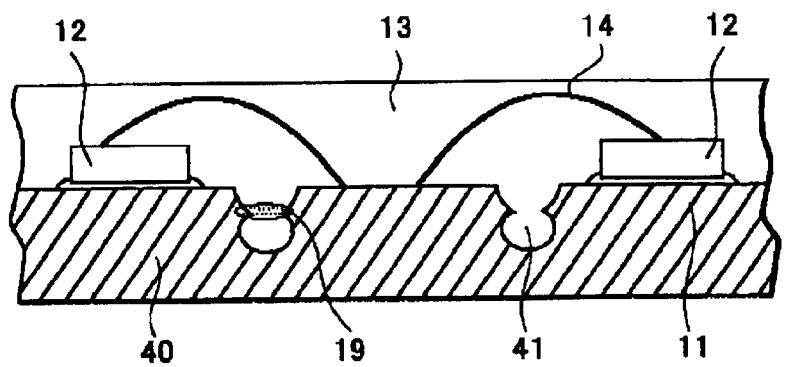
FIG. 10 is a sectional view showing a circuit device manufacturing method of the preferred embodiment.

In the third step of this embodiment, molding by insulating resin 13 is performed so as to cover circuit elements 12 at the respective mounting parts 63 in a batch and fill separation grooves 41 as shown in FIG. 10.

As shown in FIG. 10(A), in this step, insulating resin 13 covers circuit elements 12 and the plurality of conductive patterns 11, and insulating resin 13 fills separation grooves 41 between conductive patterns 11 and fits and binds strongly with the curved structures of the side surfaces of conductive patterns 11. Conductive patterns 11 are thus supported by insulating resin 13.

Also, since constricted parts 19, which are formed to be narrowed in width, are formed in separation grooves 41, the adhesion of insulating resin 13 with conductive patterns 11 is made strong by the close adhesion of insulating resin 13 to constricted parts 19. This step may be realized by transfer molding, injection molding, or dipping. With regard to the resin material, an epoxy resin or other thermosetting resin may be used for transfer molding, or a polyimide resin, polyphenylene sulfide, or other thermoplastic resin may be used for injection molding.

An advantage of this step exists in that until covering by insulating resin 13 is performed, conductive foil 40, which is to become conductive patterns 11, is the supporting substrate. Though in the related art, conductive paths 7 to 11 are formed by employing an inherently unnecessary supporting substrate 5, with the present embodiment, conductive foil 40, which serves as the supporting substrate, is a material that is necessary as an electrode material. The merit of enabling work to be performed while eliminating the component materials as much as possible is provided and cost reduction can also be realized.

Figure 11:
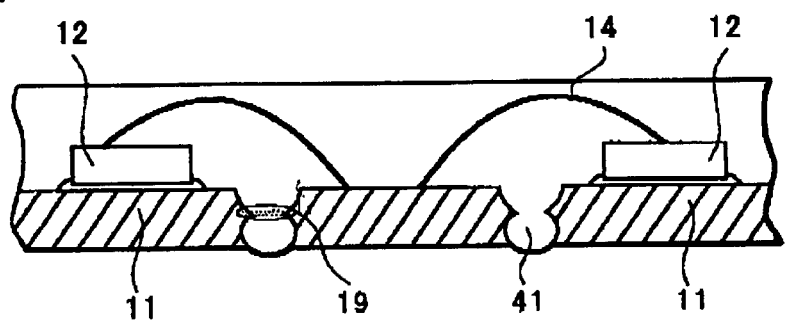
FIG. 11 is a sectional view showing a circuit device manufacturing method of the preferred embodiment.
Figure 12:
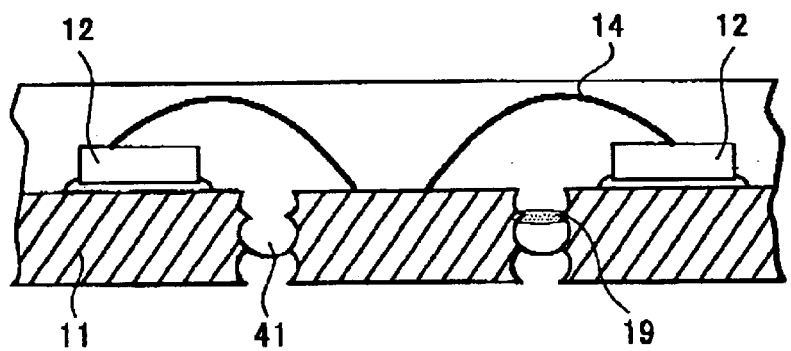
FIG. 12 is a sectional view showing a circuit device manufacturing method of the preferred embodiment.

In the fourth step of this embodiment, the respective conductive patterns 11 are electrically separated as shown in FIG. 11 and FIG. 12. Two methods may be considered for separating the respective conductive patterns. In a first method, the rear surface of conductive foil 40 is removed in an overall manner until the insulating resin 13 that is filled in separation grooves 41 becomes exposed, and in a second method, conductive foil 40 is removed selectively at locations at which separation grooves 41 are provided.

Referring now to FIG. 11, the first method of separating conductive patterns 11 shall be described. Here, the rear surface of conductive foil 40 is removed until the insulating resin 13 that is filled in the deeply formed separation grooves 41 becomes exposed in order to separate the respective conductive patterns 11. In this step, the rear surface of conductive foil 40 is removed chemically and/or physically to separate it into conductive patterns 11. This step is carried out by lapping, grinding, etching, metal vaporization by a laser, etc. Since separation grooves 41 are formed deeply, conductive patterns 11 can also be formed deeply here. Specifically, the conductive patterns can be formed thickly to approximately 150 $\mu$m.

Referring now to FIG. 12, the second method of separating conductive patterns 11 shall be described. Here, after forming a resist at the rear surface of conductive foil 40 at locations except the locations corresponding to separation grooves 41, etching is performed from the rear surface of conductive foil 40. By performing etching until the insulating resin 13 filled in separation grooves 41 becomes exposed, the respective conductive patterns 11 are separated electrically. Conductive patterns 11 that are even thicker than those formed by the above-described first method can be formed with this method, and specifically, conductive patterns 11 with a thickness of approximately 250 to 300 $\mu$m can be obtained.

By then performing rear surface treatment of conductive patterns 11, the final structure shown in FIG. 1 and FIG. 2 is obtained. That is, by coating soft solder or other conductive material onto the exposed conductive patterns 11 as necessary, rear surface electrodes 15 are formed to complete the circuit device.

Figure 13:
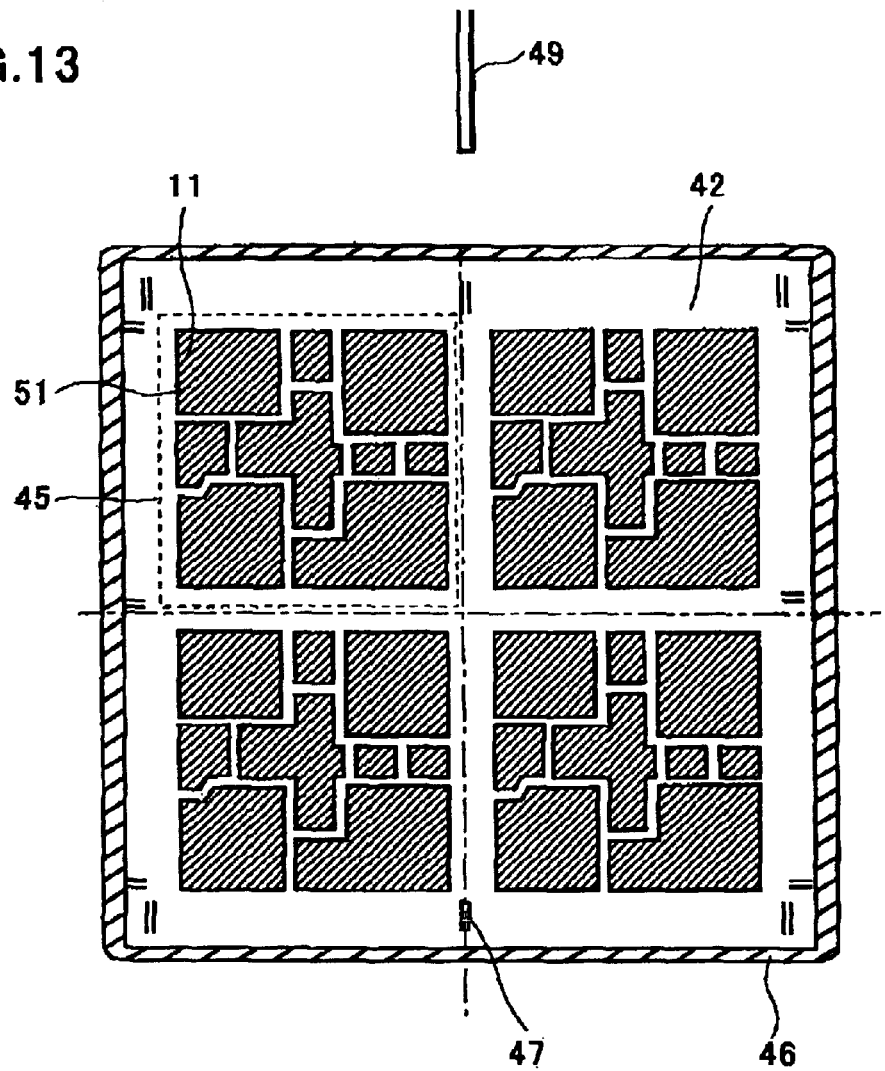
FIG. 13 is a plan view showing a circuit device manufacturing method of the preferred embodiment.
Figure 14:
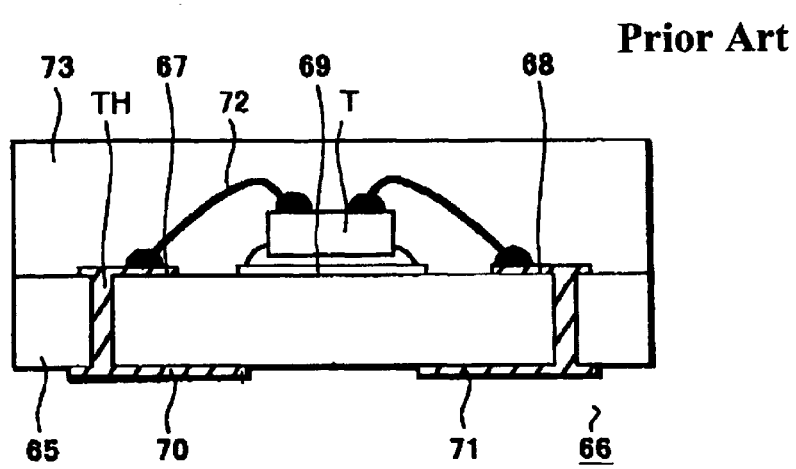
FIG. 14 is a sectional view showing a related-art circuit device.

In the fifth step of this embodiment, insulating resin 13 is diced according to the respective mounting parts 45 as shown in FIG. 13.

In this step, the insulating resin 13 in separation grooves 41 is diced along dicing lines between the respective mounting parts 45 by a dicing blade 49 to perform separation into individual circuit devices.

In this step, since only the insulating resin 13 filled in separation grooves 41 exist at the dicing lines, the wear of dicing blade 69 is low and an advantage of enabling dicing to extremely accurate external shapes without formation of metal burrs is provided.

What is claimed is:

1. A circuit device comprising: conductive patterns separated by a separation groove; circuit elements, affixed onto the conductive patterns; and an insulating resin, covering the circuit elements and the conductive patterns and filling the separation groove while exposing the rear surfaces of the conductive patterns;

wherein a protrusion is formed continuously at every side surface of the conductive patterns and the insulating resin is adhered to every protrusion.

2. The device of claim 1, wherein the thickness of the conductive patterns is made thicker than the width of the separation groove.

3. The device of claim 1, wherein the rear surface and part of the side surface of the conductive patterns are exposed from the insulating resin.

4. The device of claim 1 wherein side surfaces of the conductive patterns are formed to a curved form.

5. The device of claim 1 wherein a depth of the separation groove is more than twice the width of the separation groove.

6. The device of claim 1 wherein the conductive patterns protrude outside the insulating resin.

7. A circuit device comprising: conductive patterns separated by a separation groove; a circuit element, affixed onto the conductive pattern; and an insulating resin, covering the circuit element and the conductive patterns and filling the separation groove while exposing the rear surfaces of the conductive patterns;

wherein an etched protrusion is formed continuously at every side surface of the conductive patterns and the insulating resin is adhered to every protrusion.

8. The device of claim 7, wherein the thickness of the conductive patterns is made thicker than the width of the separation groove.

9. The device of claim 7, wherein the rear surface and part of the side surface of the conductive patterns are exposed from the insulating resin. insulating resin.

10. The device of claim 7 wherein side surfaces of the conductive pattern are formed to a curved form.

11. The device of claim 7 wherein a depth of the separation groove is more than twice the width of the separation groove.

12. The device of claim 7 wherein the conductive patters protrude outside the insulating resin.

* * * * *